(12) United States Patent
Gu et al.

(10) Patent No.: US 9,084,337 B2
(45) Date of Patent: *Jul. 14, 2015

(54) DISPLAY DEVICE

(75) Inventors: Yubo Gu, Shenzhen (CN); Liuyang Yang, Shenzhen (CN); Pei Jia, Shenzhen (CN)

(73) Assignee: SHENZHEN CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 178 days.

This patent is subject to a terminal disclaimer.

(21) Appl. No.: 13/699,747

(22) PCT Filed: Sep. 7, 2012

(86) PCT No.: PCT/CN2012/081120
§ 371 (c)(1),
(2), (4) Date: Nov. 26, 2012

(87) PCT Pub. No.: WO2014/032328
PCT Pub. Date: Mar. 6, 2014

(65) Prior Publication Data
US 2014/0055916 A1    Feb. 27, 2014

(30) Foreign Application Priority Data

Aug. 27, 2012 (CN) .......................... 2012 1 0307849

(51) Int. Cl.
*G06F 1/16* (2006.01)
*H05K 7/00* (2006.01)
*H04N 5/00* (2011.01)
*H04N 5/64* (2006.01)

(52) U.S. Cl.
CPC ................ *H05K 7/00* (2013.01); *G06F 1/1601* (2013.01); *H04N 5/00* (2013.01); *H04N 5/64* (2013.01)

(58) Field of Classification Search
CPC ...................................................... G06F 1/1601
USPC ............. 361/679.21–679.3; 348/794; 312/7.2
See application file for complete search history.

(56) References Cited

U.S. PATENT DOCUMENTS

2012/0257122 A1* 10/2012 Suzuki .......................... 348/794

* cited by examiner

*Primary Examiner* — Ramon Barrera

(57) ABSTRACT

The present invention relates to a display device, which comprises a rear cover, a display panel, a drive device, a lower veneer structure, and a first adhesive member; the drive device is arranged in the rear cover, and electrically connected to the display panel to drive the display panel; the display panel is coupled at its upper end to the upper end of the rear cover, the first adhesive member bonds the lower veneer structure to the lower end of the rear cover, and the lower veneer structure covers and supports the lower end of the display panel.

11 Claims, 4 Drawing Sheets

DISPLAY DEVICE

FIELD OF THE INVENTION

The present invention relates to a display device, and more particularly to a flat panel display device.

BACKGROUND OF THE INVENTION

Flat panel display devices such as a liquid crystal display device and a plasma display device are favored by users because of such advantages as being light and thin. The flat panel display device in the related technology generally includes a front cover, a rear cover matched with the front cover, and a display panel clamped between the front and rear covers, the rear cover being generally provided in the middle with a rectangular window for exposing the side of the display panel where an image is displayed. However, due to the presence of the front cover, a rim is formed at the periphery of the display panel, making the size of the display device further reduced such as to be subject to restrictions in the case of a certain display size.

SUMMARY OF THE INVENTION

The problem to be solved by the present invention is that, to provide an improved display device aiming at the above shortages in the related technology.

To achieve the above object, A display device is provided, comprising a rear cover, a display panel, a drive device, a lower veneer structure, and a first adhesive member; the drive device is arranged in the rear cover, and electrically connected to the display panel to drive the display panel; the display panel is coupled at its upper end to the upper end of the rear cover, the first adhesive member bonds the lower veneer structure to the lower end of the rear cover, and the lower veneer structure covers and supports the lower end of the display panel.

Preferably, the rear cover includes a bottom wall, a lower end sidewall arranged at a lower side of the bottom wall, a lower end coupling portion extending upward from the lower end sidewall, and a lower end support portion for supporting the lower end coupling portion, the first adhesive member bonding the lower veneer structure to the lower end coupling portion.

Preferably, the display device includes a lower end guide frame for guiding the drive device and the second adhesive member; the lower end guide frame includes a lower end guide sidewall and a lower end panel support portion perpendicular to the lower end guide sidewall; the lower end guide sidewall is coupled to the lower end support portion of the rear cover, and surrounds a lower end side of the drive device, the lower end panel support portion being bonded to the lower end of the display panel through the second adhesive member.

Preferably, the lower end guide frame includes a lower veneer structure support, which extends from the panel support portion to the lower veneer structure and is coupled to the lower veneer structure.

Preferably, the display device includes an upper end guide frame for guiding the drive device and a third adhesive member, the third adhesive member bonding the upper end of the display panel to the upper end guide frame that is coupled to the upper end of the rear cover.

Preferably, the upper end of the rear cover includes an upper end sidewall arranged at an upper side of the bottom wall, an upper end coupling portion extending downward from the upper end sidewall, and an upper end support portion for supporting the upper end coupling portion, the upper end guide frame being coupled to the upper end coupling portion.

Preferably, the upper end guide frame includes an upper end panel support portion and an upper end guide sidewall perpendicular to the upper end panel support portion, the upper end panel support portion being bonded to the upper end of the display panel through the first adhesive member.

Preferably, the upper end guide sidewall is coupled to the upper end support portion of the rear cover, and surrounds an upper end side of the drive device.

Preferably, the upper end support portion is connected between the upper end coupling portion and the bottom wall, and the lower end support portion is connected between the lower end coupling portion and the bottom wall.

Preferably, the lower end sidewall of the rear cover extends away from the bottom wall to form a lower end protection portion for guiding and protecting the lower side of the lower veneer structure, respectively.

The present invention has the following beneficial effects: Compared with the related technology, the display panel of the display device of the present invention is exposed at the front surface of the display device and bonded to the rear cover through the adhesive member, such that the front cover is not needed, thus reducing the manufacturing cost, decreasing weight and making the device further lighter and thinner.

BRIEF DESCRIPTION OF THE DRAWINGS

The present invention will further be described below with reference to drawings and embodiments.

DETAILED DESCRIPTION OF THE PREFERRED EMBODIMENT

The present invention will further be described below in detail with reference to specific embodiments and appended drawings of the description.

Figure 1:
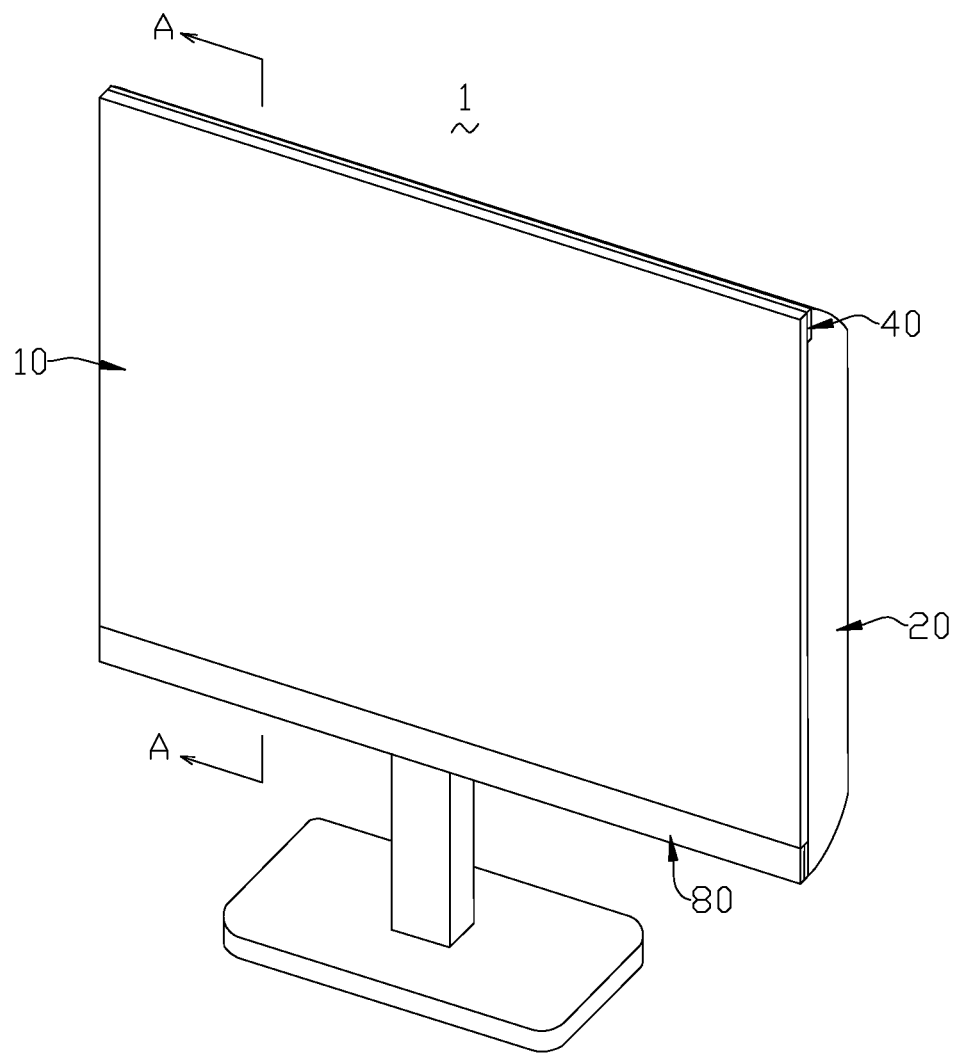
FIG. 1 is a three-dimensional schematic view of the display device according to some embodiments the present invention.
Figure 2:
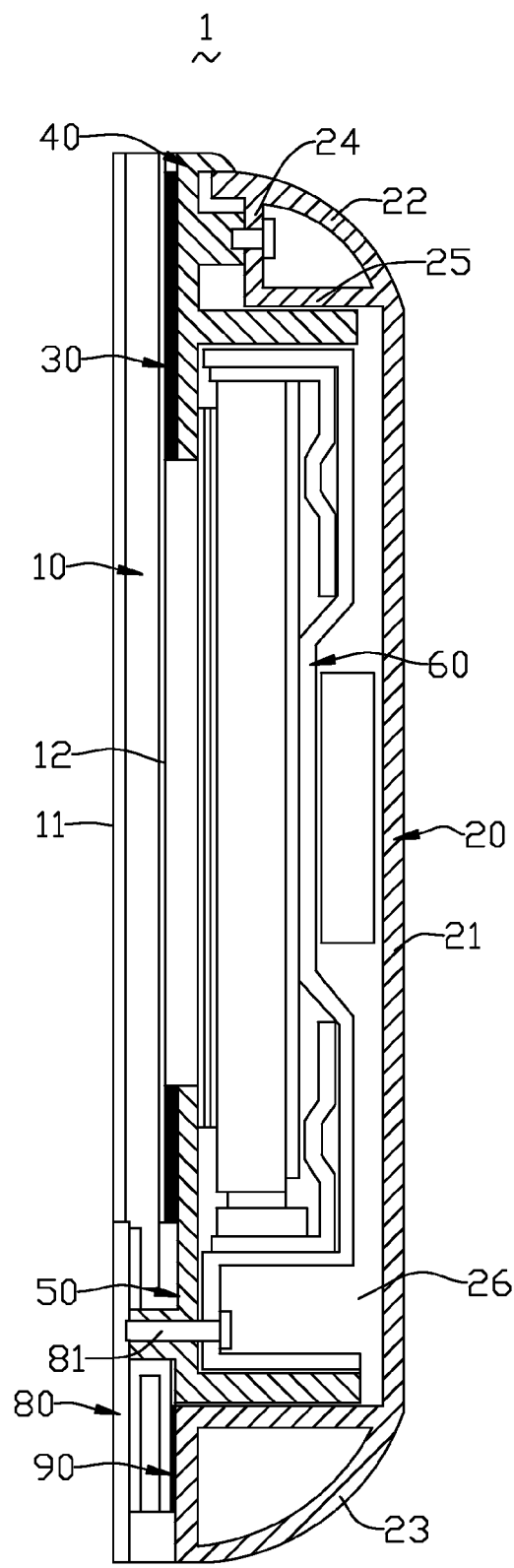
FIG. 2 is a sectional schematic view of the display device along the line A-A in FIG. 1.
Figure 3:
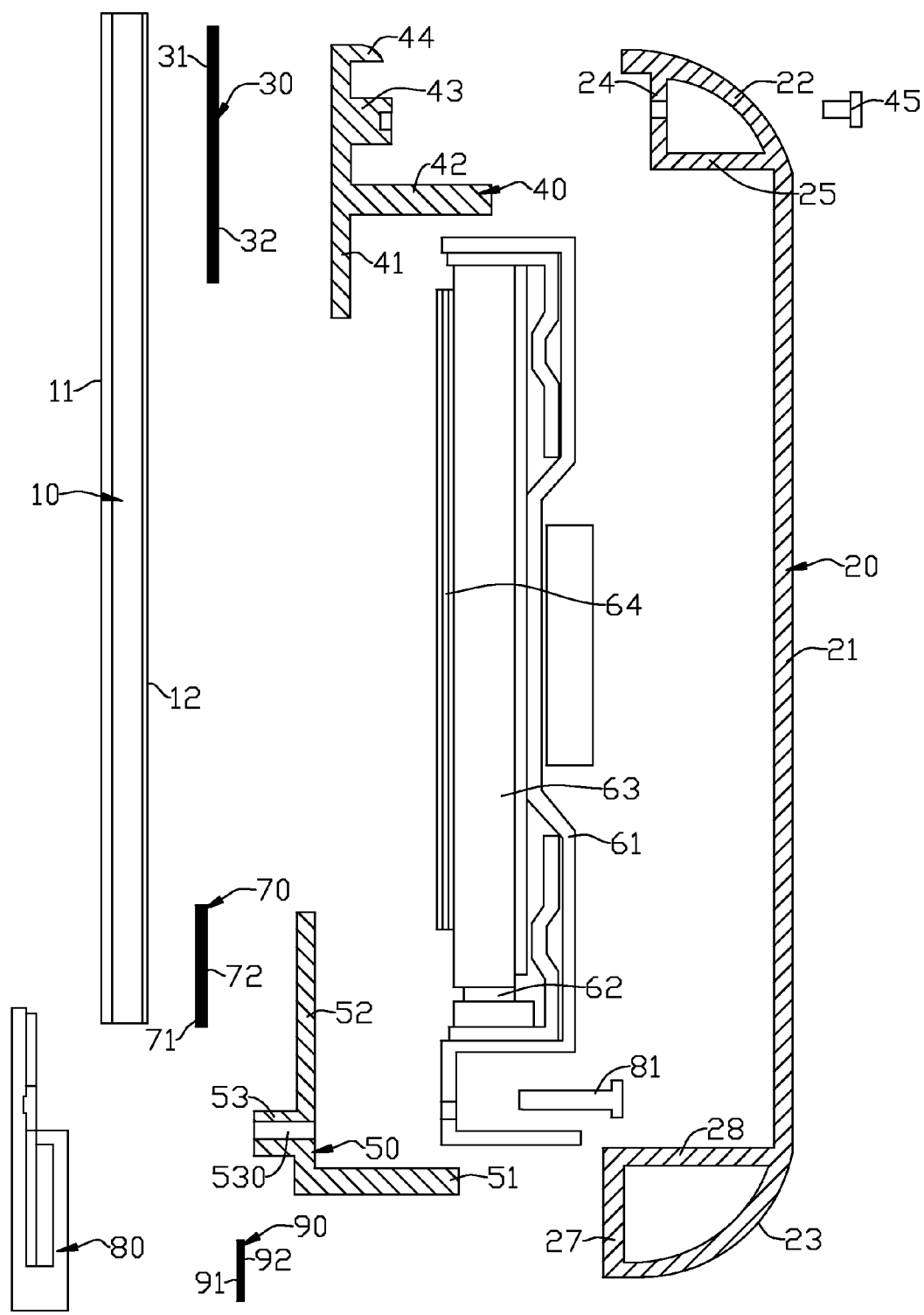
FIG. 3 is an exploded view of the display device as shown in FIG. 1.

FIG. 1 is a three-dimensional schematic view of the display device 1 according to some embodiments the present invention. FIG. 2 is a sectional schematic view of the display device 1 along the line A-A in FIG. 1. FIG. 3 is an exploded schematic view of the display device 1 as shown in FIG. 2. The display panel 10 of the display device 1 is exposed at the front surface of the display device 1 and bonded to the rear cover 20 through the adhesive member, such that the front cover is not needed, thus reducing the manufacturing cost, decreasing weight and making the device further lighter and thinner.

As shown in FIGS. 1-3, the display device 1 in some embodiments may include a display panel 10, a rear cover 20, an adhesive member 30, an upper end guide frame 40, a lower end guide frame 50, a drive device 60, an adhesive member 70, and a lower veneer structure 80. The adhesive member 30 is bonded to the upper end of the rear cover 20, the lower end guide frame 50 is coupled to the lower end of the rear cover 20, the adhesive member 70 is bonded to the lower end guide frame 50, the upper and lower ends of the display panel 10 are bonded to the adhesive member 30 and the adhesive member 70, respectively, and the lower veneer structure 80 is coupled to the lower end guide frame 50 and covers and supports the lower end of the display panel 10. The drive device 60 is arranged in the rear cover 20, and electrically connected to the display panel 10 to drive the display panel 10.

Again as shown in FIGS. 2 and 3, the display panel 10 in some embodiments may include a front side 11 and a rear side 12 opposite to the front side 11, with the front side 11 for displaying an image. The display panel 10 may be such flat panel display panels as a liquid crystal panel or a plasma panel; when the display panel 10 is the liquid crystal panel, it is only the part in the liquid crystal display device that actually displays an image and does not include a backlight module; when the display panel 10 is the plasma panel, it is only the part in the plasma display device that actually displays an image and does not include various drive circuit boards. That is, the display panel 10 does not include various drive circuit boards or backlight modules that are applied to various flat panel display devices, and is actually only the part for displaying an image.

The rear cover 20 in some embodiments may be made of such materials as plastics and metals, and includes a bottom wall 21, an upper end sidewall 22 and a lower end sidewall 23. The bottom wall 21 may be a rectangular plate in some embodiments; both the upper end sidewall 22 and the lower end sidewall 23 may be arc-shaped plates in some embodiments, and are coupled to the upper and lower sides of the bottom wall 21, respectively, to define a receiving space 26.

The upper end of the rear cover 20 may also include an upper end coupling portion 24 and an upper end support portion 25 in some embodiments. The upper end coupling portion 24 extends out from the inner side of the top edge of the upper end sidewall 22, so as to be coupled to the upper end panel support portion 41 of the upper end guide frame 40. The upper end support portion 25 extends horizontally to the bottom wall 21 from the end of the upper end coupling portion 24, so as to support the upper end coupling portion 24.

The lower end of the rear cover 20 may also include a lower end coupling portion 27 and a lower end support portion 28 in some embodiments. The lower end coupling portion 27, for being coupled to the lower veneer structure 80, extends upward from the inner side of the top edge of the lower end sidewall 23. The lower end support portion 28 extends horizontally to the bottom wall 21 from the end of the lower end coupling portion 27, so as to support the lower end coupling portion 27 and be coupled to the lower end guide frame 50.

The adhesive member 30 may include a surface 31 and a surface 32 opposite to the surface 31 in some embodiments, the surface 31 being bonded to the rear side 12 of the display panel 10; the surface 32 is bonded to the binding surface 241 of the upper end coupling portion 24 of the rear cover 20, thus coupling the upper end of the display panel 10 to the upper end of the rear cover 20. The adhesive member 30 may be Velcro tape or double-sided tape, etc. in some embodiments.

The upper end guide frame 40 may be in a T shape in some embodiments, and includes a longitudinally arranged upper end panel support portion 41 and an upper end guide sidewall 42 perpendicular to the upper end panel support portion 41, the upper end guide sidewall 42 extending to the rear cover 20 from the central part of the upper end panel support portion 41. The upper end panel support portion 41 is bonded to the surface 32 of the adhesive member 30, thus bonding the upper end panel support portion 41 to the display panel 10. The upper end guide sidewall 42 is bonded or coupled in other ways to the upper end support portion 25 of the rear cover 20, and surrounds the upper end side of the drive device 60. The upper end guide frame 40 may also include an upper end guide coupling portion 43 in some embodiments; the upper end guide coupling portion 43 extends from the upper end panel support portion 41 to the rear cover 20 and is located above the upper end guide sidewall 42, so as to be coupled to the upper end coupling portion 24 of the rear cover 20 through such connectors as a screw 45.

The lower end guide frame 50 may include in some embodiments a lower end guide sidewall 51, a lower panel support portion 52, and a lower veneer structure support portion 53. The lower end guide sidewall 51 is guided by the lower end support portion 28 of the rear cover 20, so as to surround the lower end side of the drive device 60. The lower panel support portion 52 extends perpendicularly from the end of the lower end guide sidewall 51 close to the display panel 10. The lower veneer structure support portion 53 extends from the lower end panel support portion 52 to the lower veneer structure 80, and is provided with a through hole 530 for the screw 81 to go through to be coupled to the lower veneer structure 80.

In some embodiments, the display panel 10 is the liquid crystal panel, and correspondingly the drive device 60 is the backlight module. The drive device 60 is installed at the rear side of the display panel 10, providing backlight for the display panel 10, thus making the display panel 10 display images. The drive device 60 may include a bottom cover 61, a light source 62, a light guide plate 63, and an optical sheet 64 in some embodiments. The light source 62 may be provided with a fluorescent lamp or a light emitting diode, and the light guide plate 63 is in a flat plate shape so as to transmit the light from the light source 62 to the display panel 10. The optical sheet 64 is arranged on the light guide plate 63, so as to improve the luminance characteristics of the light transmitted from the light guide plate 63 to the display panel 10. It may be comprehended that when the display panel 10 is the plasma panel, the drive device 60 may include various printed circuit board assemblies for driving the plasma panel.

The adhesive member 70 may include a surface 71 and a surface 72 opposite to the surface 71 in some embodiments, the surface 71 being bonded to the rear side 12 of the display panel 10; the surface 72 is bonded to the lower end panel support portion 52 of the lower end guide frame 50, thus bonding the lower end of the display panel 10 to the lower end guide frame 50.

The lower veneer structure 80 may be fixed to the lower veneer structure support portion 53 of the lower end guide frame 50 through such connectors as a screw 81, and covers and supports the lower end of the display panel 10 exposed outside.

The adhesive member 90 may include a surface 91 and a surface 92 opposite to the surface 91 in some embodiments, the surface 91 being bonded to the rear side of the lower veneer structure 80; the surface 92 is bonded to the lower end coupling portion 27 at the lower end of the rear cover 20, thus coupling the lower veneer structure 80 to the lower end of the rear cover 20.

Figure 4:
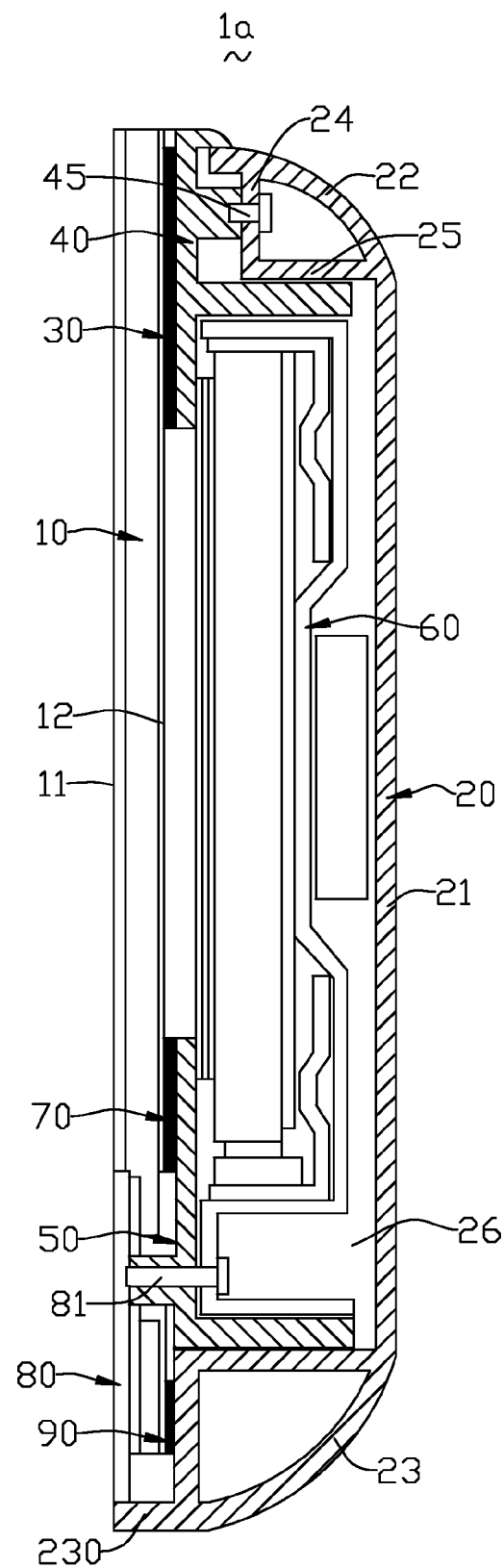
FIG. 4 is a sectional schematic view of the display device in some other embodiments of the present invention.

The display device 1a according to the other embodiment the present invention as shown in FIG. 4 has a similar structure to the display device 1. They are different from each other mainly in that the upper end sidewall 22 and the lower end sidewall 23 of the display device 1a extend further away from the bottom wall 22 to form an upper end protection portion 220 and a lower end protection portion 230. The upper end protection portion 220, perpendicular to the upper end coupling portion 24, is used for guiding and protecting the upper side of the display panel 10. The lower end protection portion 230, perpendicular to the lower end coupling portion 27, is used for guiding and protecting the lower side of the lower veneer structure 80. In some embodiments, the upper end protection portion 220 may be bonded to the upper side of the display panel 10 through the adhesive member, and the lower end protection portion 230 may be bonded to the lower side of the lower veneer structure 80 through the adhesive member.

What were described above are only the preferred embodiments of the present invention. The protection scope of the present invention is not limited to the above embodiments, and all the technical solutions achieved from the idea of the present invention shall fall within the protection scope of the present invention. For those of ordinary skill in the art, it should be indicated that improvements and modifications made under the premise of not departing from the principles of the present invention shall also be regarded as being within the protection scope of the invention.

What is claimed is:

1. A display device, comprising a rear cover, a display panel, a drive device, a lower veneer structure, and a first adhesive member, the drive device being arranged in the rear cover and electrically connected to the display panel to drive the display panel, wherein, the display panel is coupled at its upper end to an upper end of the rear cover, the first adhesive member bonds the lower veneer structure to a lower end of the rear cover, and the lower veneer structure covers and supports a lower end of the display panel;

the rear cover includes a bottom wall, a lower end sidewall arranged at a lower side of the bottom wall, a lower end coupling portion extending upward from the lower end sidewall, and a lower end support portion for supporting the lower end coupling portion, the first adhesive member bonding the lower veneer structure to the lower end coupling portion.

2. The display device of claim 1, wherein, the display device includes a lower end guide frame for guiding the drive device and a second adhesive member; the lower end guide frame includes a lower end guide sidewall and a lower end panel support portion perpendicular to the lower end guide sidewall; the lower end guide sidewall is coupled to the lower end support portion of the rear cover and surrounds a lower end side of the drive device, the lower end panel support portion being bonded to the lower end of the display panel through the second adhesive member.

3. The display device of claim 2, wherein, the lower end guide frame includes a lower veneer structure support, which extends from the panel support portion to the lower veneer structure and is coupled to the lower veneer structure.

4. The display device of claims 1, wherein, the display device includes an upper end guide frame for guiding the drive device and a third adhesive member, the third adhesive member bonding the upper end of the display panel to the upper end guide frame that is coupled to the upper end of the rear cover.

5. The display device of claim 4, wherein, the upper end of the rear cover includes an upper end sidewall arranged at an upper side of the bottom wall, an upper end coupling portion extending downward from the upper end sidewall, and an upper end support portion for supporting the upper end coupling portion, the upper end guide frame being coupled to the upper end coupling portion.

6. The display device of claim 5, wherein, the upper end guide frame includes an upper end panel support portion and an upper end guide sidewall perpendicular to the upper end panel support portion, the upper end panel support portion being bonded to the upper end of the display panel through the third adhesive member.

7. The display device of claim 6, wherein, the upper end guide sidewall is coupled to the upper end support portion of the rear cover, and surrounds an upper end side of the drive device.

8. The display device of claim 5, wherein, the upper end support portion is connected between the upper end coupling portion and the bottom wall, and the lower end support portion is connected between the lower end coupling portion and the bottom wall.

9. The display device of claim 1, wherein, a lower end sidewall of the rear cover extends away from the bottom wall to form a lower end protection portion for guiding and protecting a lower side of the lower veneer structure, respectively.

10. The display device of claim 2, wherein, the display device includes an upper end guide frame for guiding the drive device and a third adhesive member, the third adhesive member bonding the upper end of the display panel to the upper end guide frame that is coupled to the upper end of the rear cover.

11. The display device of claim 3, wherein, the display device includes an upper end guide frame for guiding the drive device and a third adhesive member, the third adhesive member bonding the upper end of the display panel to the upper end guide frame that is coupled to the upper end of the rear cover.

* * * * *